(12) United States Patent
Müllner et al.

(10) Patent No.: US 11,094,440 B2
(45) Date of Patent: Aug. 17, 2021

(54) LINEARLY ENHANCED CIRCULAR MAGNETIC FIELD ACTUATOR

(71) Applicant: BOISE STATE UNIVERSITY, Boise, ID (US)

(72) Inventors: Peter Müllner, Boise, ID (US); Geoffrey Johnston, Boise, ID (US)

(73) Assignee: Boise State University, Boise, ID (US)

( * ) Notice: Subject to any disclaimer, the term of this patent is extended or adjusted under 35 U.S.C. 154(b) by 0 days.

(21) Appl. No.: 16/834,273

(22) Filed: Mar. 30, 2020

(65) Prior Publication Data

US 2020/0312506 A1 Oct. 1, 2020

Related U.S. Application Data

(60) Provisional application No. 62/825,398, filed on Mar. 28, 2019.

(51) Int. Cl.
 *H01F 7/02* (2006.01)
(52) U.S. Cl.
 CPC ........... *H01F 7/021* (2013.01); *H01F 7/0273* (2013.01)
(58) Field of Classification Search
 CPC ............................. H01F 7/021; H01F 7/0273
 USPC .......................................................... 335/306
 See application file for complete search history.

(56) References Cited

U.S. PATENT DOCUMENTS

| 9,819,287 B2* | 11/2017 | Mullner | H01L 41/12 |
| 2011/0057751 A1* | 3/2011 | Feil | H01H 71/2454 |
| | | | 335/205 |
| 2013/0038414 A1* | 2/2013 | Lautenberg | H01L 41/06 |
| | | | 335/229 |
| 2019/0304651 A1* | 10/2019 | Laufenberg | H01F 7/1646 |
| 2020/0066965 A1* | 2/2020 | Mullner | G12B 1/02 |

\* cited by examiner

*Primary Examiner* — Alexander Talpalatski
(74) *Attorney, Agent, or Firm* — Parsons Behle & Latimer

(57) ABSTRACT

An apparatus may include a rotatable permanent magnet exhibiting a magnetic field. Alternatively, the actuation apparatus may include a set of coils configured to generate a rotatable magnetic field. The apparatus may further include a magnetic shape memory (MSM) element including MSM material and having a long axis, where the MSM element is configured to contract locally in a first part in response to local exposure to a first component of the magnetic field that is substantially perpendicular to the long axis and to not contract locally in a second part that is exposed to a second component of the magnetic field that is not substantially perpendicular to the long axis. The apparatus may include a first fixed magnet positioned at a first end of the MSM element and a second fixed magnet positioned at a second end of the MSM element.

20 Claims, 4 Drawing Sheets

LINEARLY ENHANCED CIRCULAR MAGNETIC FIELD ACTUATOR

CROSS-REFERENCE TO RELATED APPLICATIONS

This application claims priority to U.S. Provisional Patent Application No. 62/825,398, filed on Mar. 28, 2019, and entitled "Linearly Enhanced Circular Magnetic Field Generator and Pump," the contents of which are hereby incorporated by reference herein in their entirety.

FIELD OF THE DISCLOSURE

This disclosure is generally related to the field of circular magnetic field actuators and, in particular, to a circular magnetic field actuator with linear magnetic enhancements.

BACKGROUND

Magnetic shape memory (MSM) elements may be formed from an MSM alloy (MSMA) that deforms strongly when subjected to a variable magnetic field. Various actuation devices may use MSM elements in conjunction with a magnetic field for actuation.

For example, an actuation device may operate by creating a local constriction within an elongated MSM element in response to a localized magnetic field created by a permanent magnet. When the magnet is rotated, the constriction may move along the MSM element. By using the constriction to define a cavity capable of holding a fluid, the actuation device may be used as a micropump to pump. In some examples, rather than using a permanent magnet exhibiting a circular magnetic field, a set of coils may be linearly aligned and parallel to the MSM element. Electrical currents may be passed through the coils and may be progressively reversed to move the localized magnetic field and thereby move the constriction along the MSM element. In some examples, at least two coils may be positioned at an angle of approximately 90 degrees to each other and each coil may be powered with alternating current (AC) currents having a 90-degree phase shift from each other to simulate a circular rotating magnetic field.

In each of these examples, the definition of the constriction in the MSM element may depend on the strength of perpendicular components of the magnetic field (e.g., having strong magnetic field lines that are perpendicular to a long axis of the MSM element) at the local constriction and on the strength of parallel components of the magnetic field (e.g., having strong magnetic field lines that are parallel to the MSM element). For some applications, a single magnetic source for a rotating magnetic field may not produce a sufficiently powerful magnetic field, or may not produce an efficiently shaped magnetic field, to form a well-defined constriction in the MSM element. Further, applications with an electrically powered single magnetic source may use significant amounts of electrical power to produce the rotating magnetic field. Other disadvantages may exist.

SUMMARY

In an embodiment, an actuation apparatus includes a rotatable permanent magnet exhibiting a magnetic field, the rotatable permanent magnet configured to rotate about an axis of rotation. The apparatus further includes a MSM element comprising MSM material and having a long axis, where the MSM element is configured to contract locally in a first part in response to local exposure to a first component of the magnetic field that is substantially perpendicular to the long axis and to not contract locally in a second part that is exposed to a component of the magnetic field that is not substantially perpendicular to the long axis. The apparatus also includes a first fixed magnet positioned at a first end of the MSM element along the long axis. The apparatus includes a second fixed magnet positioned at a second end of the MSM element along the long axis.

In some embodiments, the first fixed magnet and the second fixed magnet are configured to have opposing magnetizing directions. In some embodiments, the first fixed magnet and the second fixed magnet include permanent magnets. In some embodiments, the first fixed magnet and the second fixed magnet include electromagnets. In some embodiments, the MSM element is offset from the axis of rotation in a first direction and the apparatus further includes a magnetic yoke positioned at least partially at a point offset from the axis of rotation in a second direction opposite the first direction, where the magnetic yoke magnetically connects the point to the first fixed magnet and the second fixed magnet. In some embodiments, the apparatus includes a pump housing having an inlet and an outlet, where the long axis of the MSM element extends from the inlet to the outlet.

In an embodiment, an actuation apparatus includes a first electrical coil having a first longitudinal axis and a second electrical coil having a second longitudinal axis. The apparatus further includes an MSM element including MSM material and having a long axis, where the first longitudinal axis is positioned at a first angle relative to the long axis of the MSM element, where the second longitudinal axis is positioned at a second angle relative to the long axis, where the first longitudinal axis is positioned at a third angle relative to the second longitudinal axis, and where the first electrical coil and the second electrical coil generate a magnetic field that rotates about an axis of rotation in response to driving the first electrical coil with a first AC signal and driving the second electrical coil with a second AC signal having a substantially 90 degree phase difference from the first AC signal. The apparatus also includes a first fixed magnet positioned at a first end of the MSM element along the long axis. The apparatus includes a second fixed magnet positioned at a second end of the MSM element along the long axis.

In some embodiments, the first fixed magnet and the second fixed magnet are configured to have opposing magnetizing directions. In some embodiments, the first fixed magnet and the second fixed magnet include permanent magnets. In some embodiments, the first fixed magnet and the second fixed magnet includes electromagnets. In some embodiments, the first fixed magnet is driven by a third AC signal having a 45-degree phase difference from the first AC signal, and where the second fixed magnet is driven by a fourth AC signal having a 90-degree difference from the third AC signal. In some embodiments, the MSM element is offset from the axis of rotation in a first direction and the apparatus includes a magnetic yoke positioned at least partially at a point offset from the axis of rotation in a second direction opposite the first direction, where the magnetic yoke magnetically connects the point to the first fixed magnet and the second fixed magnet. In some embodiments, the apparatus includes a pump housing having an inlet and an outlet, where the long axis of the MSM element extends from the inlet to the outlet. In some embodiments, the first angle is substantially 45 degrees, wherein the second angle is substantially 45 degrees, and wherein the third angle is substantially 90 degrees.

In an embodiment, an actuation method includes rotating a first magnetic field about an axis of rotation. The method further includes contracting an MSM element locally in a first part of the MSM element in response to local exposure to a first component of the magnetic field that is substantially perpendicular to a long axis of the MSM element while simultaneously not contracting the MSM element locally in a second part of the MSM element that is exposed to a component of the magnetic field that is not substantially perpendicular to the long axis. The method also includes applying a second magnetic field to a first end of the MSM element along the long axis. The method includes applying a third magnetic field to a second end of the MSM element along the long axis.

In some embodiments, rotating the first magnetic field comprises rotating a permanent magnet. In some embodiments, rotating the first magnetic field comprises driving a first electrical coil with a first AC signal and driving a second electrical coil with a second AC signal having a substantially 90-degree phase difference from the first AC signal. In some embodiments, the second magnetic field and the third magnetic field have opposing magnetizing directions. In some embodiments, the MSM element is offset from the axis of rotation in a first direction and the method includes directing a combined magnetic field through a magnetic yoke to a point offset from the axis of rotation in a second direction opposite the first direction. In some embodiments, the method includes displacing a fluid through a pump housing having an inlet and an outlet in response to the rotating the first magnetic field about the axis of rotation, where the long axis of the MSM element extends from the inlet to the outlet.

Figure 1:
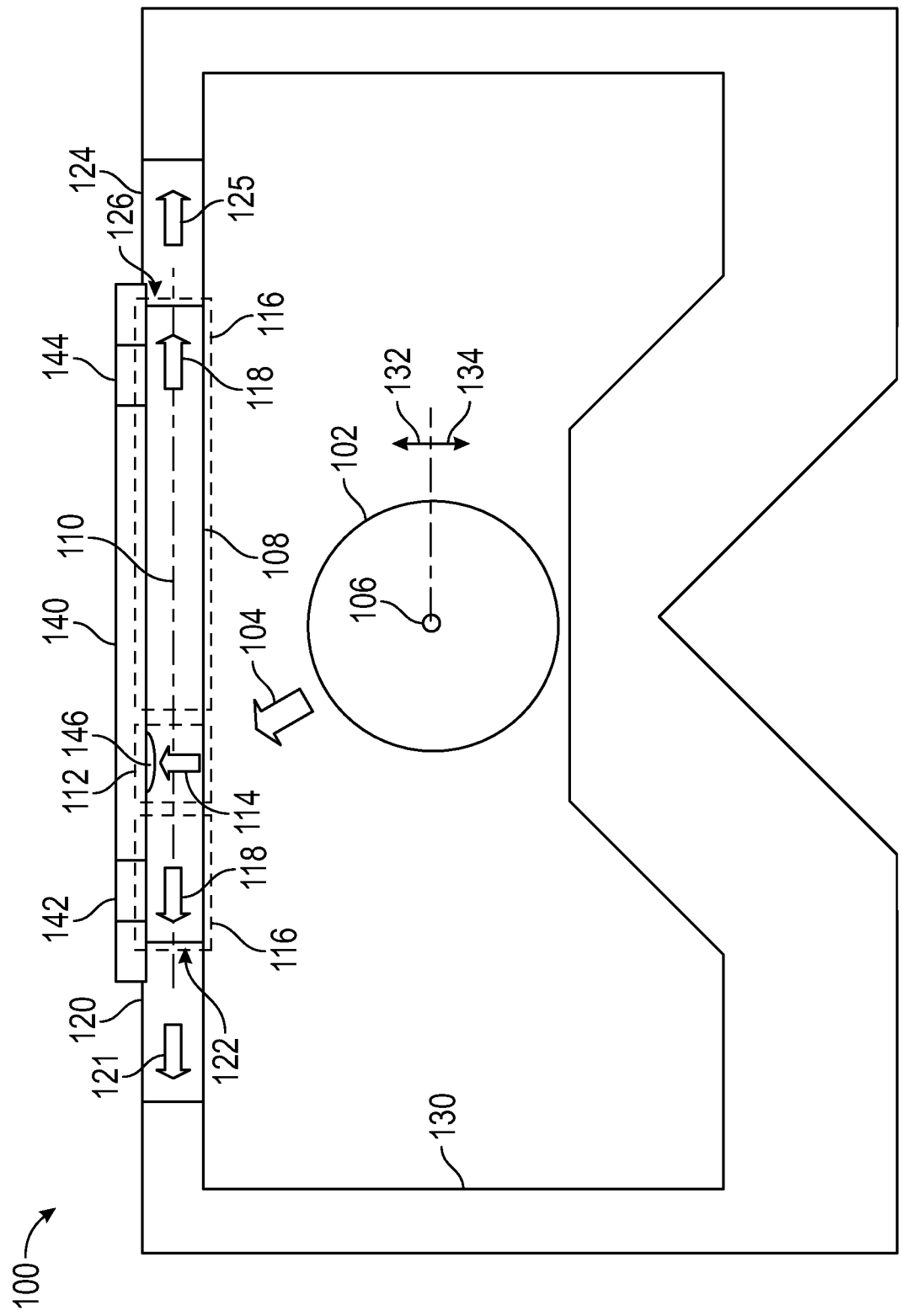
FIG. 1 is a diagram depicting an embodiment of an actuation apparatus.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure.

DETAILED DESCRIPTION

Examples of MSM actuation and/or micropump devices and systems may be found in U.S. Pat. No. 9,091,251, issued on Jul. 28, 2015, and entitled, "Actuation Method and Apparatus, Micropump, and PCR Enhancement Method," and in U.S. patent application Ser. No. 16/545,632, filed on Aug. 20, 2019, published as U.S. 2020/0066965 on Feb. 27, 2020, and entitled "Circular Magnetic Field Generator and Pump," the contents of both of which are hereby incorporated by reference in their entirety. In these cases, rotating magnetic fields may be used to actuate an MSM element and may be created by rotating permanent magnet or by positioning a set of coils at a substantially right angle relative to each other and powering them with AC signals that are phase offset from each other by substantially 90 degrees.

A different configuration for MSM actuation and/or micropump devices that uses linear coils may be found in U.S. Pat. No. 10,408,215, issued on Sep. 10, 2019, and entitled "Electrically Driven Magnetic Shape Memory Apparatus and Method", which is hereby incorporated by reference in its entirety. Systems relying on coils in a linear configuration may operate at a reduced power by including permanent magnets to direct a magnetic field through the MSM element as described in U.S. Pat. No. 10,535,457, issued on Jan. 14, 2020, and entitled "Electrically Driven Magnetic Shape Memory Apparatus and Method," the contents of which are hereby incorporated by reference in their entirety.

Referring to FIG. 1, an actuation apparatus 100 is depicted that may improve upon MSM actuators that rely on rotating magnetic fields for actuation. The actuation apparatus 100 may include a rotatable permanent magnet 102, an MSM element 108, a first permanent magnet 120, a second permanent magnet 124, and a magnetic yoke 130.

The rotatable permanent magnet 102 may exhibit a magnetic field 104 and may be configured to rotate about an axis of rotation 106. For clarity, the magnetic field 104 is depicted as an arrow indicating the overall polarization of the magnetic field. It should be understood that, in reality, the magnetic field 104 emanates from a first pole of the rotatable permanent magnet 102 in a vector field that ultimately returns to a second pole of the rotatable permanent magnet 102 in a closed circuit. Rather than illustrating the entire vector field as a set of field lines, FIG. 1 depicts the magnetic field 104 as an arrow and depicts various components 114, 118 of the magnetic field 104 within the MSM element 108 as arrows as well. In particular, the magnetic field 104 may include a first component 114 that is perpendicular to the long axis 110 and one or more second components 118 that are non-perpendicular. As the rotatable permanent magnet 102 rotates around the axis of rotation 106, the magnetic field 104 may move along the MSM element 108, for example, from right to left. The first component 114 of the magnetic field 104 may, likewise, move through the MSM element 108.

The MSM element 108 may include MSM material, such as and alloy of nickel, manganese, and gallium, another type of material, or combinations thereof. Descriptions of the MSM material may be found in U.S. Pat. No. 9,091,251 entitled, "Actuation Method and Apparatus, Micropump, and PCR Enhancement Method," and in U.S. patent application Ser. No. 16/545,632 entitled "Circular Magnetic Field Generator and Pump," referenced above.

The MSM element 108 may have a long axis 110 and may be configured to contract locally (e.g., through twinning) in a first part 112 in response to local exposure to a first component 114 of the magnetic field 104 that is substantially perpendicular to the long axis 110. The MSM element 108 may further not contract locally in one or more second parts 116 that are exposed to the one or more second components 118 that are not substantially perpendicular to the long axis 110. The contraction may form a neck in the first part 112 of the MSM element 108 resulting in a space 146. A pump housing 140 may be positioned adjacent to the MSM element 108. The pump housing 140 may include an inlet 142 and an outlet 144. The long axis 110 of the MSM element 108 may extend from the inlet 142 to the outlet 144.

In the configuration depicted in FIG. 1, the MSM element 108 may be offset from the axis of rotation 106 in a first direction 132. The apparatus 100 may include a magnetic yoke 130 positioned at least partially at a point offset from the axis of rotation 106 in a second direction 134 opposite the first direction 132. In practice, the magnetic yoke 130 may direct the magnetic field 104 from the MSM element 108 to the point on the other side of the rotatable permanent magnet 102 to complete a magnetic circuit.

The first permanent magnet 120 may be positioned at a first end 122 of the MSM element 108 along the long axis 110. Likewise, the second permanent magnet 124 may be positioned at a second end 126 of the MSM element 108 along the long axis 110. The two magnets 120, 124 may have opposing magnetization directions. The addition of two magnets 120, 124 in a configuration as shown in FIG. 1 may enhance the magnetic field strength in the MSM element 108 when the poles (i.e., the arrow directions) are aligned as shown. As the rotatable permanent magnet 102 rotates magnetic field 104 becomes reversed relative to the MSM element 108 and relative to the two magnets 120, 124. The two magnets 120, 124 may diminish the magnetic field strength within the MSM element 108 when all three poles (associated with the two permanent magnets 120, 124 and the rotatable permanent magnet) oppose each other relative to the MSM element 108. Thus, when the two magnets 120, 124 are permanent magnets, they may enhance and diminish the magnetic field 104 within the MSM element once per full rotation of the rotatable permanent magnet 102. The magnetic yoke 130 may further enhance the magnetic field 104 by completing a magnetic circuit through the MSM element 108.

During operation, the magnetic field 104 may be rotated about the axis of rotation 106. This rotation may cause the first component 114 of the magnetic field 104 to travel horizontally along the MSM element 108. The MSM element 108 may contract locally in the first part 112 of the MSM element 108 in response to local exposure to the first component 114 while simultaneously not contracting in the one or more second parts 116 of the MSM element 108. The first part 112 may have a space 146 formed within the MSM element 108 due to the contraction and may move horizontally along with the first component 114 of the magnetic field 104. The space 146 may be used to move a fluid from the inlet 142 to the outlet 144 of the pump housing 140.

In order to strengthen the components 118 of the magnetic field 104 the first permanent magnet 120 may apply a second magnetic field 121 to a first end 122 of the MSM element 108 along the long axis 110 and the second permanent magnet 124 may apply a third magnetic field 125 to a second end 126 of the MSM element 108. When the magnetic fields 121, 125 align with a direction of the magnetic field 104, the one or more second components 118 (the non-perpendicular components) of the magnetic field 104 may be enhanced, further preventing contraction in the parts 116 of the MSM element 108. This may strengthen the shape of the space 146.

A benefit of the apparatus 100 is that the magnetic field 104 need not be as strong due to the additional magnetic fields 121, 125, which can result in less expensive manufacturing costs. Further, the actuation effect on the MSM element 108 may be more consistent when under the effect of the magnets 120, 124. This configuration may be particularly beneficial when used with a rotating magnetic field, such as the magnetic field 104 because such a field may be weaker at the ends 122, 126 of the MSM element 108 due to the farther distance from the axis of rotation 106. Other benefits may exist.

Figure 2:
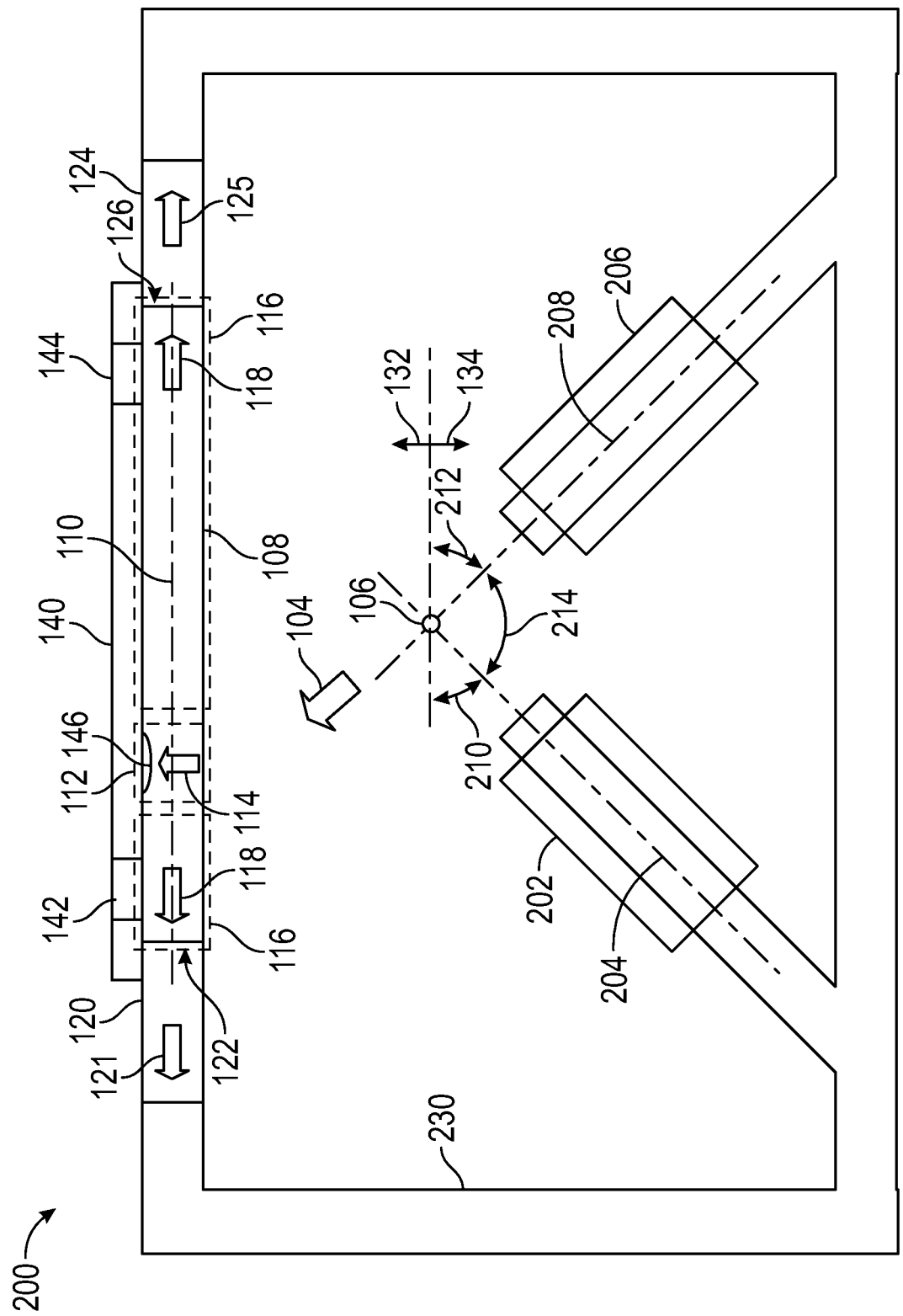
FIG. 2 is a diagram depicting an embodiment of an actuation apparatus.

Referring to FIG. 2, an actuation apparatus 200 is depicted that may improve upon MSM actuators that rely on rotating magnetic fields for actuation. The actuation apparatus 100 may include a first electrical coil 202, a second electrical coil 206, an MSM element 108, a first permanent magnet 120, a second permanent magnet 124, and a magnetic yoke 230.

The first electrical coil 202 may have a first longitudinal axis 204 and the second electrical coil 206 may have a second longitudinal axis 208, and the MSM element 108 may have a long axis 110. The longitudinal axes 204, 208 may run along the center of the electrical coils 202, 206. The first longitudinal axis 204 may be positioned at a first angle 210 relative to the long axis 110 of the MSM element 108. Likewise, the second longitudinal axis 208 may be positioned at a second angle 212 relative to the long axis 110 of the MSM element 108. The first angle 210 and the second angle 212 may both be substantially 45 degrees.

For clarity, FIG. 2 shows a horizontal line 216 drawn through an axis of rotation where line 216 has been drawn parallel to the long axis 110 of the MSM element 108. This is to better show the angles 210, 212, 214 relative to the MSM element 108.

The first longitudinal axis 204 may be positioned at a third angle 214 relative to the second longitudinal axis 208. The third angle may be substantially 90 degrees. Similar to the apparatus of FIG. 1, the first electrical coil 202 and the second electrical coil 206 of FIG. 2 may generate a magnetic field 104 that rotates about the axis of rotation 106. This may be accomplished by driving the first electrical coil 202 with a first AC signal and driving the second electrical coil 206 with a second AC signal having a substantially 90-degree phase difference from the first AC signal. An apparatus having this two-coil configuration is further described in in U.S. patent application Ser. No. 16/545,632 entitled "Circular Magnetic Field Generator and Pump," references above.

The MSM element 108 may be configured to contract locally in a first part 112 of the MSM element 108 in response to local exposure to a first component 114 of the magnetic field 104 that is substantially perpendicular to the long axis 110 and to not contract locally in one or more second parts 116 that are exposed to one or more second components 118 of the magnetic field 104 that are not substantially perpendicular to the long axis 110. A pump housing 140 may be positioned adjacent to the MSM element 108. The pump housing 140 may include an inlet 142 and an outlet 144. The long axis 110 of the MSM element 108 may extend from the inlet 142 to the outlet 144. The contraction within the MSM element 108 may form a space 146 in the MSM element that may be used to move fluid from the inlet 142 to the outlet 144.

The first permanent magnet 120 may be positioned at a first end 122 of the MSM element 108 along the long axis 110 and the second permanent magnet 124 may be positioned at a second end 126 of the MSM element 108 along the long axis 110. The first permanent magnet 120 may be associated with a second magnetic field 121 and the second permanent magnet 124 may be associated with a third magnetic field 125. The two magnets 120, 124 may have opposing magnetization directions. As in the apparatus 100 of FIG. 1, the two magnets 120, 124 may enhance and diminish the magnetic field 104 within the MSM element once per full rotation of the rotatable permanent magnet 102.

The magnetic yoke 230 may further enhance the magnetic field 104 by completing a magnetic circuit through the MSM element 108. For example, as depicted in FIG. 2, the magnetic yoke 230 may form at least part of a core for each of the coils 202, 206 and may direct the magnetic field 104 in a complete circuit from the MSM element 108 positioned in one direction from the axis of rotation 106 to a point, e.g., within the cores, positioned in another direction from the axis of rotation 106.

Figure 3:
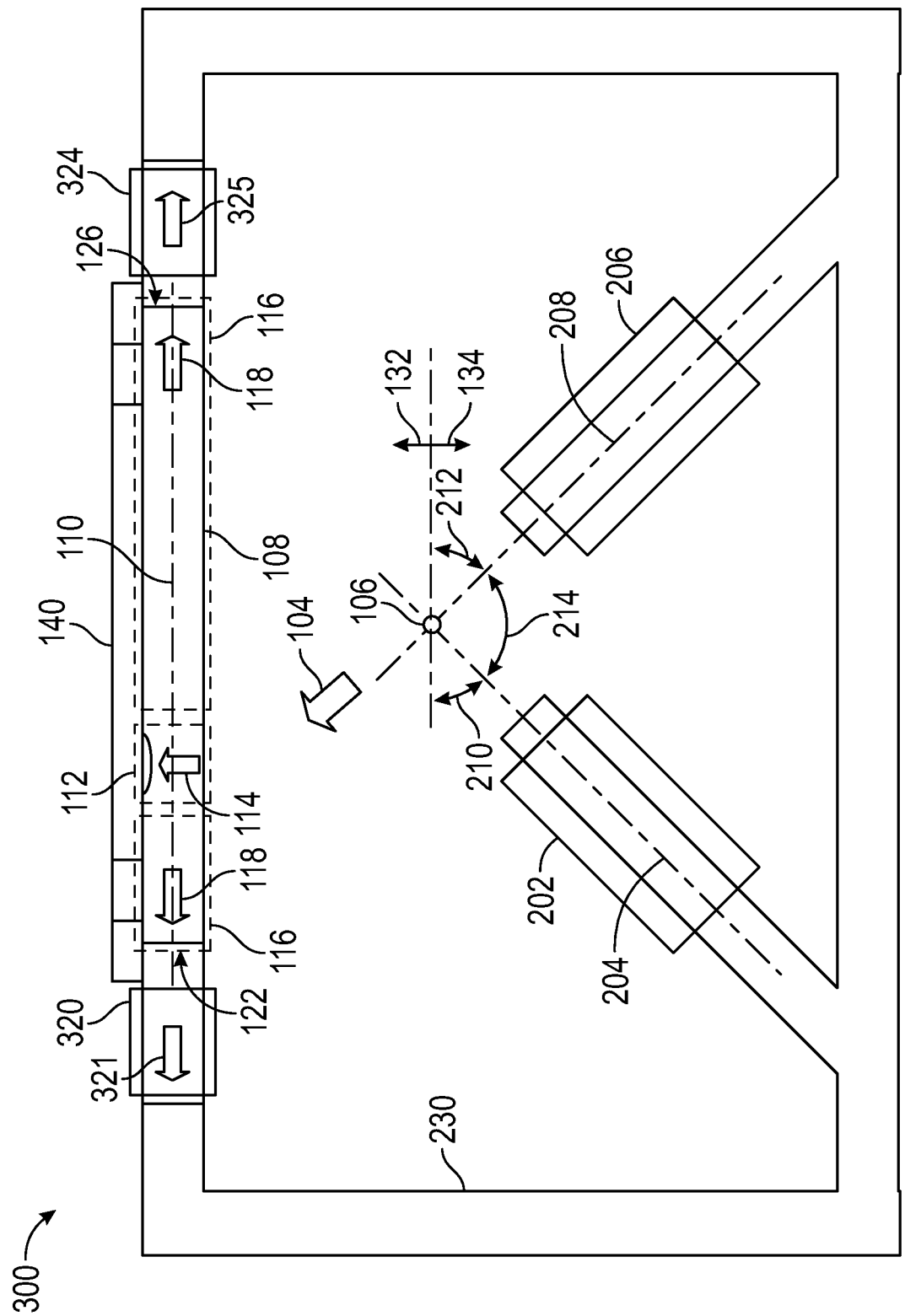
FIG. 3 is a diagram depicting an embodiment of an actuation apparatus.

Referring to FIG. 3, an actuation apparatus 300 is depicted that may further improve upon MSM actuators that rely on rotating magnetic fields for actuation. The actuation apparatus 100 may include a first electrical coil 202, a second electrical coil 206, an MSM element 108, a first electromagnet 320, a second electromagnet 324, and a magnetic yoke 230.

As with FIG. 2, in the apparatus 300 of FIG. 3, the first electrical coil 202 may have a first longitudinal axis 204 and the second electrical coil 206 may have a second longitudinal axis 208, and the MSM element 108 may have a long axis 110. The first longitudinal axis 204 may be positioned at a first angle 210 (e.g., 45 degrees) relative to the long axis 110 of the MSM element 108 and the second longitudinal axis 208 may be positioned at a second angle 212 (e.g., 45 degrees) relative to the long axis 110 of the MSM element 108.

The first longitudinal axis 204 may be positioned at a third angle 214 (e.g., 90 degrees) relative to the second longitudinal axis 208. The first electrical coil 202 and the second electrical coil 206 may generate a magnetic field 104 that rotates about the axis of rotation 106. This may be accomplished by driving the first electrical coil 202 with a first AC signal and driving the second electrical coil 206 with a second AC signal having a substantially 90-degree phase difference from the first AC signal.

The MSM element 108 may be configured to contract locally in a first part 112 of the MSM element 108 in response to local exposure to a first component 114 of the magnetic field 104 that is substantially perpendicular to the long axis 110 and to not contract locally in one or more second parts 116 that are exposed to one or more second components 118 of the magnetic field 104 that are not substantially perpendicular to the long axis 110. A pump housing 140 may be positioned adjacent to the MSM element 108. The pump housing 140 may include an inlet 142 and an outlet 144. The long axis 110 of the MSM element 108 may extend from the inlet 142 to the outlet 144. The contraction within the MSM element 108 may form a space 146 in the MSM element that may be used to move fluid from the inlet 142 to the outlet 144.

In the apparatus 300 of FIG. 3, the first electromagnet 320 may be driven by a third AC signal having a 45 degree phase difference from the first AC signal used to drive the first electrical coil 202. The second electromagnet 324 may be driven by a fourth AC signal having a 90-degree difference from the third AC signal. In that way, as the alternating currents driving the electrical coils 202, 206 change and cause the magnetic field 104 to rotate, the electromagnets 320, 324 may simultaneously change polarity so that when the first component 114 of the magnetic field 104 is in a first orientation (such as the "upward" orientation depicted in FIG. 3) their associated magnetic fields 321, 325 may be oriented outward, as shown. This may enhance the one or more second components 118 (non-perpendicular components). When the magnetic field 104 is in a second orientation (such as a "downward" orientation), the magnetic fields 321, 324 may be oriented in an inward direction, which would also enhance the second components 118 of the magnetic field 104 (since in that case the magnetic fields 321, 325 would also be directed inward).

A benefit of the apparatus 300 is that by using the electromagnets 320, 324, the magnetic field 104 may be enhanced multiple times per rotation, which may result in more consistent and accurate actuation. Other benefits may exist.

Figure 4:
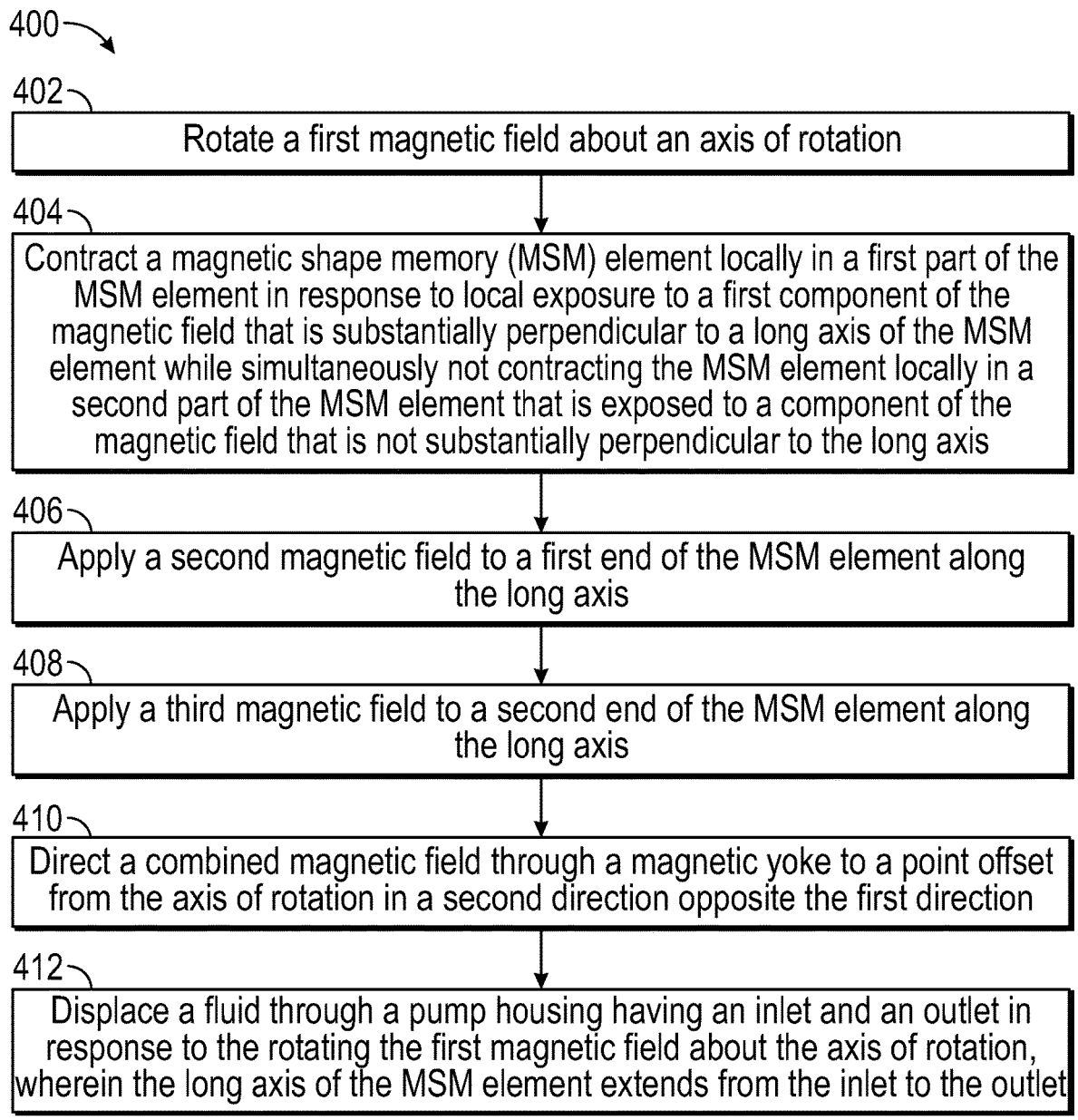
FIG. 4 is a flow chart depicting an embodiment of an actuation method.

Referring to FIG. 4, an embodiment of an actuation method 400 is depicted. The method 400 may include rotating a first magnetic field about an axis of rotation, at 402. For example, the rotatable permanent magnet 102 may be rotated about its axis of rotation 106. As another example, the coils 202, 206 may generate a rotating magnetic field 104 about the axis of rotation 106.

The method 400 may further include contracting a magnetic shape memory (MSM) element locally in a first part of the MSM element in response to local exposure to a first component of the magnetic field that is substantially perpendicular to a long axis of the MSM element while simultaneously not contracting the MSM element locally in a second part of the MSM element that is exposed to a component of the magnetic field that is not substantially perpendicular to the long axis, at 404. For example, the MSM element 108 may contract locally in the first part 112 in response to the first component 114 of the magnetic field 104.

The method 400 may also include applying a second magnetic field to a first end of the MSM element along the long axis, at 406. For example, the first permanent magnet 120 may apply the second magnetic field 121 to the MSM element 108. As another example, the first electromagnet 320 may apply the second magnetic field 321 to the MSM element 108.

The method 400 may include applying a third magnetic field to a second end of the MSM element along the long axis, at 408. For example, the second permanent magnet 124 may apply the third magnetic field 125 to the MSM element 108. As another example, the second electromagnet 324 may apply the third magnetic field 325 to the MSM element 108.

The method 400 may include directing a combined magnetic field through a magnetic yoke to a point offset from the axis of rotation in a second direction opposite the first direction, at 410. For example, a magnetic circuit may be completed by directing the combination of the magnetic field 104, the second magnetic field 121 (or the second magnetic field 321), and the third magnetic field 125 (or the third magnetic field 325) through the magnetic yoke 130 (or the magnetic yoke 230).

The method 400 may include displacing a fluid through a pump housing having an inlet and an outlet in response to the rotating the first magnetic field about the axis of rotation, wherein the long axis of the MSM element extends from the inlet to the outlet, at 412. For example, a fluid may be displaced through the pump housing 140 using the space 146 as it moves along the MSM element 108 in response to movement of the magnetic field 104.

Although various embodiments have been shown and described, the present disclosure is not so limited and will be understood to include all such modifications and variations as would be apparent to one skilled in the art.

What is claimed is:

1. An actuation apparatus comprising:
   a rotatable permanent magnet exhibiting a magnetic field, the rotatable permanent magnet configured to rotate about an axis of rotation;
   a magnetic shape memory (MSM) element comprising MSM material and having a long axis, wherein the MSM element is configured to contract locally in a first part in response to local exposure to a first component of the magnetic field that is substantially perpendicular to the long axis and to not contract locally in a second part that is exposed to a second component of the magnetic field that is not substantially perpendicular to the long axis;
a first fixed magnet positioned at a first end of the MSM element along the long axis; and
a second fixed magnet positioned at a second end of the MSM element along the long axis.

2. The actuation apparatus of claim 1, wherein the first fixed magnet and the second fixed magnet are configured to have opposing magnetizing directions.

3. The actuation apparatus of claim 1, wherein the first fixed magnet and the second fixed magnet comprise permanent magnets.

4. The actuation apparatus of claim 1, wherein the first fixed magnet and the second fixed magnet comprise electromagnets.

5. The actuation apparatus of claim 1, wherein the MSM element is offset from the axis of rotation in a first direction, the apparatus further comprising:
a magnetic yoke positioned at least partially at a point offset from the axis of rotation in a second direction opposite the first direction, wherein the magnetic yoke magnetically connects the point to the first fixed magnet and the second fixed magnet.

6. The actuation apparatus of claim 1, further comprising:
a pump housing having an inlet and an outlet, wherein the long axis of the MSM element extends from the inlet to the outlet.

7. An actuation apparatus comprising:
a first electrical coil having a first longitudinal axis;
a second electrical coil having a second longitudinal axis;
a magnetic shape memory (MSM) element comprising MSM material and having a long axis, wherein the first longitudinal axis is positioned at a first angle relative to the long axis of the MSM element, wherein the second longitudinal axis is positioned at a second angle relative to the long axis, wherein the first longitudinal axis is positioned at a third angle relative to the second longitudinal axis, and wherein the first electrical coil and the second electrical coil generate a magnetic field that rotates about an axis of rotation in response to driving the first electrical coil with a first AC signal and driving the second electrical coil with a second AC signal having a substantially 90 degree phase difference from the first AC signal;
a first fixed magnet positioned at a first end of the MSM element along the long axis; and
a second fixed magnet positioned at a second end of the MSM element along the long axis.

8. The actuation apparatus of claim 7, wherein the first fixed magnet and the second fixed magnet are configured to have opposing magnetizing directions.

9. The actuation apparatus of claim 7, wherein the first fixed magnet and the second fixed magnet comprise permanent magnets.

10. The actuation apparatus of claim 7, wherein the first fixed magnet and the second fixed magnet comprise electromagnets.

11. The actuation apparatus of claim 10, wherein the first fixed magnet is driven by a third AC signal having a 45 degree phase difference from the first AC signal, and wherein the second fixed magnet is driven by a fourth AC signal having a 90 degree difference from the third AC signal.

12. The actuation apparatus of claim 7, wherein the MSM element is offset from the axis of rotation in a first direction, the apparatus further comprising:
a magnetic yoke positioned at least partially at a point offset from the axis of rotation in a second direction opposite the first direction, wherein the magnetic yoke magnetically connects the point to the first fixed magnet and the second fixed magnet.

13. The actuation apparatus of claim 7, further comprising:
a pump housing having an inlet and an outlet, wherein the long axis of the MSM element extends from the inlet to the outlet.

14. The actuation apparatus of claim 7, wherein the first angle is substantially 45 degrees, wherein the second angle is substantially 45 degrees, and wherein the third angle is substantially 90 degrees.

15. An actuation method comprising:
rotating a first magnetic field about an axis of rotation;
contracting a magnetic shape memory (MSM) element locally in a first part of the MSM element in response to local exposure to a first component of the magnetic field that is substantially perpendicular to a long axis of the MSM element while simultaneously not contracting the MSM element locally in a second part of the MSM element that is exposed to a component of the magnetic field that is not substantially perpendicular to the long axis;
applying a second magnetic field to a first end of the MSM element along the long axis; and
applying a third magnetic field to a second end of the MSM element along the long axis.

16. The method of claim 15, wherein rotating the first magnetic field comprises rotating a permanent magnet.

17. The method of claim 15, wherein rotating the first magnetic field comprises driving a first electrical coil with a first AC signal and driving a second electrical coil with a second AC signal having a substantially 90-degree phase difference from the first AC signal.

18. The actuation method of claim 15, wherein the second magnetic field and the third magnetic field have opposing magnetizing directions.

19. The actuation method of claim 15, wherein the MSM element is offset from the axis of rotation in a first direction, the method further comprising:
directing a combined magnetic field through a magnetic yoke to a point offset from the axis of rotation in a second direction opposite the first direction.

20. The actuation method of claim 15, further comprising:
displacing a fluid through a pump housing having an inlet and an outlet in response to the rotating the first magnetic field about the axis of rotation, wherein the long axis of the MSM element extends from the inlet to the outlet.

* * * * *